United States Patent
Yoo

(10) Patent No.: US 9,583,561 B2
(45) Date of Patent: *Feb. 28, 2017

(54) SCHOTTKY DIODES WITH MESH STYLE REGION AND ASSOCIATED METHODS

(71) Applicant: Monolithic Power Systems, Inc., San Jose, CA (US)

(72) Inventor: Ji-Hyoung Yoo, Cupertino, CA (US)

(73) Assignee: MONOLITHIC POWER SYSTEMS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/671,772

(22) Filed: Mar. 27, 2015

(65) Prior Publication Data

US 2016/0284793 A1    Sep. 29, 2016

(51) Int. Cl.
| | | |
|---|---|---|
| H01L 27/07 | (2006.01) | |
| H01L 29/06 | (2006.01) | |
| H01L 29/872 | (2006.01) | |
| H01L 29/66 | (2006.01) | |

(52) U.S. Cl.
CPC .... H01L 29/0619 (2013.01); H01L 29/66143 (2013.01); H01L 29/872 (2013.01)

(58) Field of Classification Search
CPC ............... H01L 27/0766; H01L 29/47; H01L 29/66143; H01L 29/66212; H01L 29/7806; H01L 29/782; H01L 31/108; H01L 31/1085; H01L 51/0579; H01L 33/0033; H01L 2924/12032

See application file for complete search history.

(56) References Cited

U.S. PATENT DOCUMENTS

| | | | |
|---|---|---|---|
| 8,368,167 B1 | 2/2013 | Urienza | |
| 8,749,014 B2 | 6/2014 | Yoo | |
| 8,809,988 B2 | 8/2014 | Yoo et al. | |
| 2005/0029615 A1* | 2/2005 | Tanaka | H01L 27/0814 257/484 |
| 2012/0056294 A1* | 3/2012 | Yoo | H01L 29/0619 257/484 |

* cited by examiner

*Primary Examiner* — Hoai V Pham

(57) ABSTRACT

A Schottky diode comprising a cathode region, an anode region and a guard ring region, wherein the anode region may comprise a metal Schottky contact, and the guard ring region may comprise an outer guard ring and a plurality of inner open stripes inside the outer guard ring, and wherein the inner open stripes has a shallower junction depth than the outer guard ring.

16 Claims, 5 Drawing Sheets

SCHOTTKY DIODES WITH MESH STYLE REGION AND ASSOCIATED METHODS

TECHNICAL FIELD

The present technology generally relates to semiconductor device, and more particularly relates to Schottky diodes.

BACKGROUND

A Schottky diode is in an "ON" state when forward biased and current flows through the diode; the Schottky diode is in an "OFF" state when reversely biased and ideally current will not flow through the diode. However, Schottky diodes are not ideal, and thus will experience a small amount of reverse leakage current. Reverse leakage is detrimental to the performance of a circuit and results in a loss of power in the circuit. Accordingly, a Schottky diode with low reverse leakage current and high forward current drivability is desired.

SUMMARY

It is an object of the present invention to provide a Schottky diode with low reverse leakage current and high forward current drivability in a given anode area.

In accomplishing the above objective, there has been provided, in accordance with an embodiment of the present invention, a semiconductor device, comprising: a semiconductor layer of a first doping type; a guard ring region located in the semiconductor layer, wherein the guard ring region is of a second doping type, and wherein the guard ring region comprises: an outer guard ring; and an inner mesh style region having a plurality of parallel open stripes configured to form a depletion region; a metal Schottky contact located over the guard ring region; and a cathode contact region having the first doping type located in the semiconductor layer and outside of the guard ring region.

In accomplishing the above objective, there has been provided, in accordance with an embodiment of the present invention, a Schottky diode, comprising: a cathode region; an anode region, comprising a metal Schottky contact; and a guard ring region, wherein the guard ring region comprises an outer guard ring and a plurality of parallel inner open stripes inside the outer guard ring, and wherein the inner open stripe has a narrower width and a shallow junction depth than the outer guard ring.

Furthermore, there has been provided, in accordance with an embodiment of the present invention, a method of forming a Schottky diode, comprising: forming a cathode region of a first doping type in a semiconductor layer; forming an outer guard ring of a second doping type in the semiconductor layer; forming an inner mesh style region of the second doping type in the semiconductor layer, wherein the inner mesh style region is formed with a shallower junction than the outer guard ring, and wherein the inner mesh style region is formed inside the outer guard ring; and forming a metal Schottky contact.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments. These drawings are not necessarily drawn to scale. The relative sizes of elements illustrated by the drawings may differ from the relative size depicted.

The use of the same reference label in different drawings indicates the same or like components.

DETAILED DESCRIPTION

The following description provides exemplary embodiments of the technology. One skilled in the art will understand that the technology may be practiced without some or all of the features described herein. In some instances, well known structures and functions have not been shown or described in detail to avoid unnecessarily obscuring the description of the embodiments of the technology. In some instances, similar structures and functions that have been described in detail for other embodiments are not been described in detail for such embodiments to simplify and make clear understanding of the embodiments. It is intended that the terminology used in the description presented below be interpreted in its broadest reasonable manner, even though it is being used in conjunction with a detailed description of certain embodiments of the technology.

Figure 1:
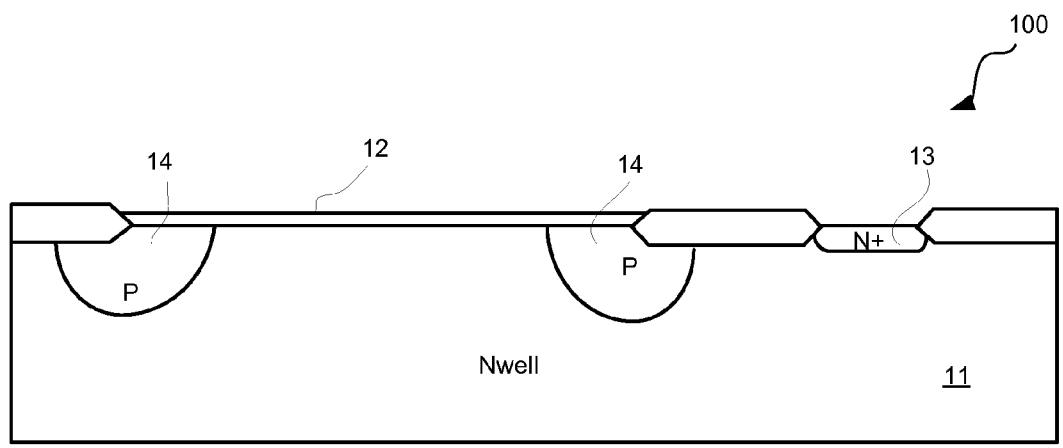
FIG. 1 shows a prior art Schottky diode with a guard ring region as a prior art.

FIG. 1 shows a prior art Schottky diode 100. The electrical field between the anode contact 12 and the semiconductor material 11 needs to be minimized to reduce reverse current and to achieve higher breakdown voltage. Accordingly, the prior art high voltage Schottky diode 100 adopts deep and lightly doped P type ring 14 as a guard ring region to reduce the high electrical field near the anode contact 12.

Figure 2:
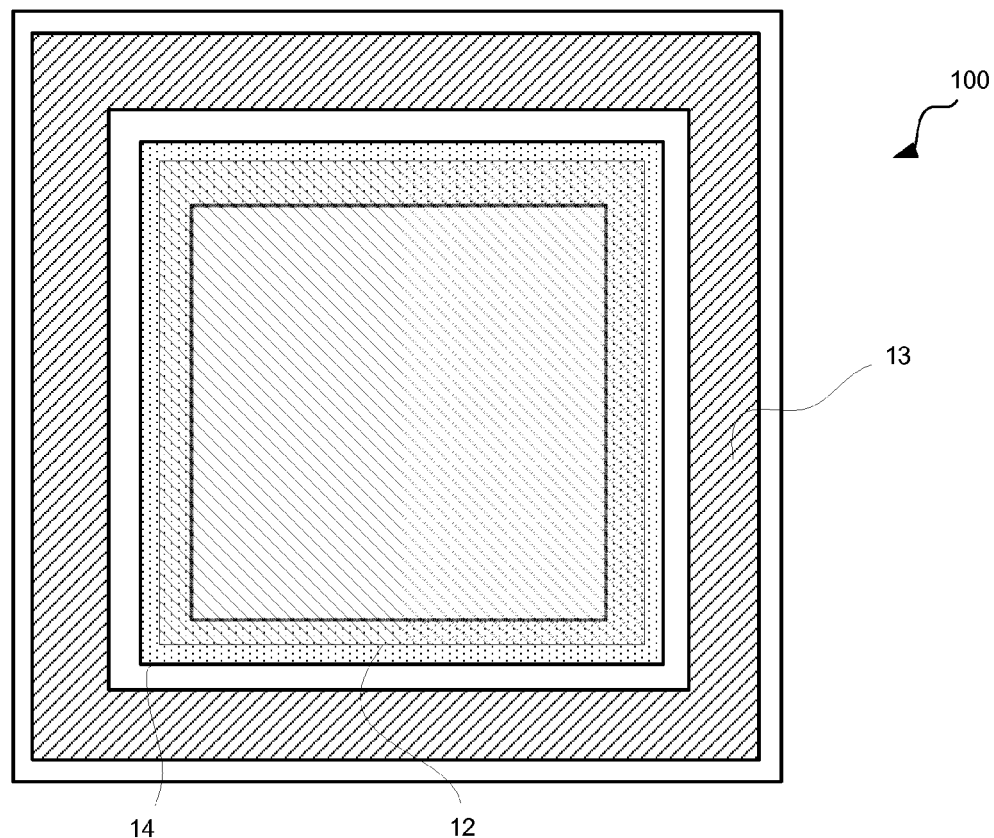
FIG. 2 shows a layout diagram of the prior art Schottky diode in FIG. 1.

FIG. 2 shows a layout diagram of the prior art Schottky diode 100 as shown in FIG. 1. Cathode contact region 13 is positioned at the edge of the diode 100 and the guard ring region 14 is positioned out at the periphery of the metal Schottky contact 12. For the prior art Schottky diode 100, deep guard ring region 14 is required to substantially reduce the electric field near the metal Schottky contact. However, deep guard ring region 14 consumes a large area, and the integrating density is poor.

Accordingly, improved devices are desired to address the above deficiencies.

Figure 3:
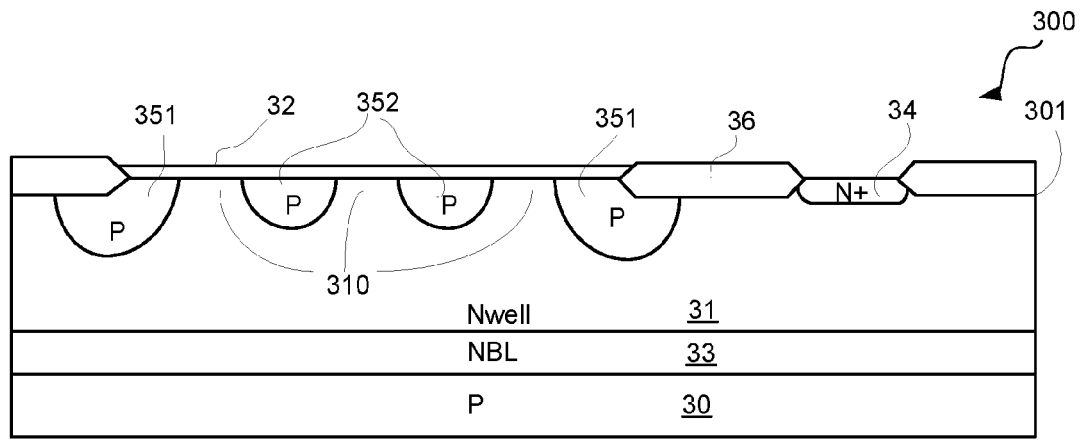
FIG. 3 shows a semiconductor device 300 comprising a Schottky diode with mesh style region in accordance with an embodiment of the present invention.

FIG. 3 shows a semiconductor device 300 comprising a Schottky diode with mesh style region in accordance with an embodiment of the present invention. The semiconductor device 300 is manufactured by forming an outer guard ring and forming an inner mesh style region, wherein the outer guard ring encloses the mesh style region. With the outer guard ring and the inner mesh style region, the reverse leakage current may decrease, the forward current drivability is enhanced and the breakdown voltage is improved.

The term of "mesh style region" means that the region has a plurality of open stripes which makes a depletion region of the Schottky diode having a mesh pattern from the top view, wherein the "mesh pattern" means that the depletion region other than the outer guard ring and the open stripes is connected as a net with eyes. The term of "open stripe" means that the stripe has one or more than one openings in the stripe.

The Schottky diode 300 comprises a semiconductor substrate 30, an N type semiconductor layer 31, a metal Schottky contact 32, a cathode contact region 34 and a guard ring region. The guard ring region comprises an outer guard ring 351 and an inner mesh style region 352 having a shallower depth than the outer guard ring 351. In a preferred embodiment, the outer guard ring 351 and the inner mesh style region 352 contact each other and the guard ring region comprises a completed region. In another embodiment, the outer guard ring 351 and the inner mesh style region 352 are separate regions and the guard ring region may comprise a plurality of P type doped regions. The semiconductor layer 31 is N type and is formed on the semiconductor substrate 30. The guard ring region (351, 352) and the cathode contact region 34 are formed in the semiconductor layer 31, wherein the cathode contact region 34 is outside of the guard ring region. The metal Schottky contact 32 is formed on the semiconductor layer 31 and covers the guard ring region (351, 352). In the shown embodiment in FIG. 3, the device further comprises an N type buried layer (NBL) 33 between the semiconductor substrate 30 and the N type semiconductor layer 31. The NBL layer has a higher doping concentration than the semiconductor layer 31. In some other embodiments, the NBL layer is not essential. In the shown embodiment in FIG. 3, the device further comprises a field oxide 36 between the metal Schottky contact 32 and the cathode contact region 34. In other embodiments, the field oxide 36 is replaced with other dielectric materials. The shown semiconductor substrate 30 in FIG. 3 is P type. However, other types of material may be adopted as the semiconductor substrate 30.

From another view, Schottky diode 300 comprises an anode region, a cathode region and a guard ring region (351, 352). The region(s) of the semiconductor layer 31 near a top surface 301 and covered by the metal Schottky contact 32 comprises a Schottky interface 310. The anode region comprises the metal Schottky contact 32 and the Schottky interface 310. In the shown embodiment in FIG. 3, the guard ring region is P type and comprises the outer guard ring 351 and the inner mesh style region 352 formed in the N type semiconductor layer 31 near the metal Schottky contact 32. At the cathode region, the highly doped N type cathode contact region 34 is formed at the top surface 301 of the semiconductor layer 31 as shown in FIG. 3. The cathode region may further comprise a metal layer formed above the cathode contact region 34.

Between the anode region and the cathode region, the field oxide 36 is formed at the top surface 301 of the semiconductor device 300 to isolate the anode region and the cathode region.

Referring again to the anode region, in one embodiment, the metal Schottky contact is titanium and the semiconductor layer 31 is a lightly doped semiconductor material. In one embodiment, the semiconductor material is silicon. For the embodiment shown in FIG. 3, the semiconductor layer 31 is a lightly doped N well. In one embodiment, the semiconductor layer 31 may be doped with a plurality of doping concentration levels. Besides, the thickness of the semiconductor layer 31 could be controlled to adjust the breakdown voltage of the Schottky diode 300. The thicker the semiconductor layer 31, the higher the break down voltage is. However, a thicker semiconductor layer 31 may decrease the current drivability of the Schottky diode.

Continuing with FIG. 3, the outer guard ring 351 is deeper than the inner mesh style region 352. A higher breakdown voltage may be achieved when the Schottky diode 300 has a deeper outer guard ring 351. Thus in one embodiment, the breakdown voltage of Schottky diode 300 may be adjusted by controlling the depth of the outer guard ring 351. The outer guard ring 351 encloses the inner mesh style region 352. The inner mesh style region 352 comprises multiple inner open stripes and is enclosed by outer guard ring 351. Since inner mesh style region 352 is doped with a shallower junction depth than outer guard ring 351, inner mesh style region 352 allows a narrower shape than outer guard ring 351. The shallow inner open stripes may achieve a high forward current drivability for the Schottky diode 300. And the narrow inner open stripes may achieve a high integration density by placing the inner open stripes 352 closely. The inner open stripes 352 may be placed closer to further decrease the reverse leakage current. With appropriate layout configuration of outer guard ring 351 and inner guard ring region 352, the size of the anode region may be reduced for a predetermined breakdown voltage, a predetermined current carrying ability or a predetermined reversed leakage current.

Figure 4:
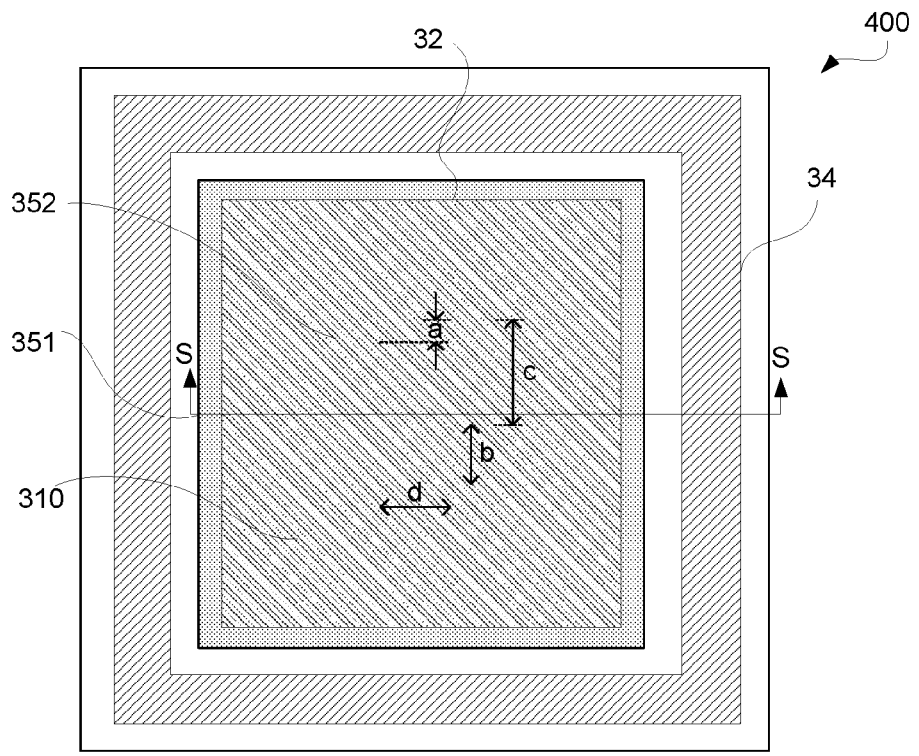
FIG. 4 illustrates a layout diagram of a Schottky diode 400 in accordance with an embodiment of the present invention.

FIG. 4 illustrates a layout diagram of a Schottky diode 400 in accordance with an embodiment of the present invention. In one embodiment, Schottky diode 400 represents the layout diagram of Schottky diode 300 in FIG. 3 where the sectional diagram of FIG. 3 is diced from the line of S-S in FIG. 4. Referring to FIG. 4, the pattern filled with up-right diagonal lines represents the cathode contact region 34 or the cathode contact region; the pattern filled with uniform dots represents the guard ring region; and the pattern filled with up-left diagonal lines represents the metal Schottky contact 32. The guard ring region comprises the outer guard ring 351 and the inner mesh style region 352. In the shown embodiment, the outer guard ring 351 comprising a closed ring shape encloses an array of parallel inner open stripes 352. In the shown embodiment, an inner open stripe 352 has a narrower width and a shallower junction depth than the outer guard ring stripe 351. Meanwhile, the cathode contact region 34 encloses the guard ring region (351, 352). In another embodiment, the cathode contact region 34 is outside of the guard ring region (351, 352) and may partly enclose the guard ring region (351, 352) from the top plane view of a semiconductor die. The metal Schottky contact 32 covers over the most part of the guard ring region (351, 352) where the outer guard ring 351 is at the edge of metal Schottky contact 32. The complementary region(s) of the guard ring region (351, 352) beneath the metal Schottky contact 32 comprises the Schottky interface 310. The layout pattern of the Schottky diode 400 shows that the Schottky interface 310 intervenes with the guard ring region (351, 352). The term of "intervene" means that at least one direction can be found from a top plane view of a semiconductor device and when dicing the semiconductor device in this direction, three or more guard ring stripes including outer guard ring stripes 351 and inner open stripes 352 can be found. In the shown embodiment of FIG. 4, four stripes (351, 352, 352 and 351 in sequence) are found when dicing the semiconductor device 400 from the direction of S-S. The inner mesh style region 352 comprises a plurality of open stripes such that Schottky interface 310 is divided into a plurality of connected Schottky interface regions.

As shown in FIG. 4, an overlap "a" between two neighboring stripes should be large enough to decrease the leakage current of the Schottky diode. The space "b" of the opening in a stripe should be completely blocked by the neighboring stripe. Large space "b" will enhance the forward current drivability, but will make leakage current high. A length "c" of a single stripe between two openings in the inner mesh style region 352 is b+2a. A distance "d" of the neighboring stripes may be decreased to further decrease the reverse leakage current. In a favorite embodiment, the overlap "a" between two neighboring stripes is in a range of 0.2 µm~1 µm; the space "b" of the opening in a stripe is in a range of 0.5 µm~2 µm; the length "c" of a single stripe between two openings in the inner mesh style region 352 is in a range of 2×b~3×b; and the distance "d" of the neighboring stripes is in a range of 0.5 µm~b.

Figure 5A:
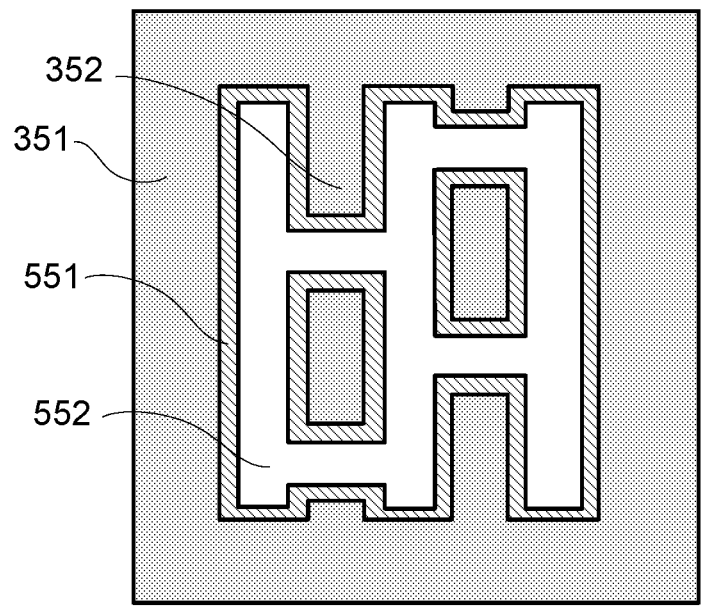
FIG. 5A shows a depletion layer and an effective anode region diagram of the guard ring region (351, 352) when the Schottky diode 400 is in a forward biased condition.

FIG. 5A shows a depletion layer and an effective anode region diagram of the guard ring region (351, 352) when the Schottky diode 400 is in a forward biased condition. As shown in FIG. 5A, the depletion region 551 filled with up-left diagonal lines is formed next to guard ring region (351, 352). Since the Schottky diode is in a forward biased condition, the width of the depletion region 551 is small and it leaves region 552 open to conduct current. The region 552 is the effective anode area that handles current in the forward biased condition.

Figure 5B:
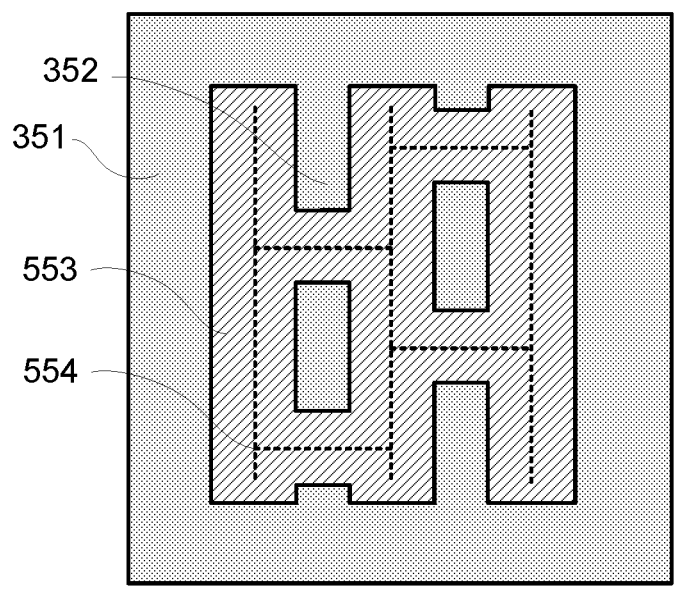
FIG. 5B shows the depletion layer diagram of the guard ring region (351, 352) when the Schottky diode 400 is in a reverse biased condition.

FIG. 5B shows the depletion layer diagram of the guard ring region (351, 352) when the Schottky diode 400 is in a reverse biased condition. As shown in FIG. 5B, the pattern 553 filled with up-right diagonal lines represents the depletion region. The line 554 shows that the anode area is completely closed by depletion region in the reverse biased condition so as to decrease the leakage current. If there's a gap in the depletion region, then the Schottky diode's leakage current will be increased.

Figure 6:
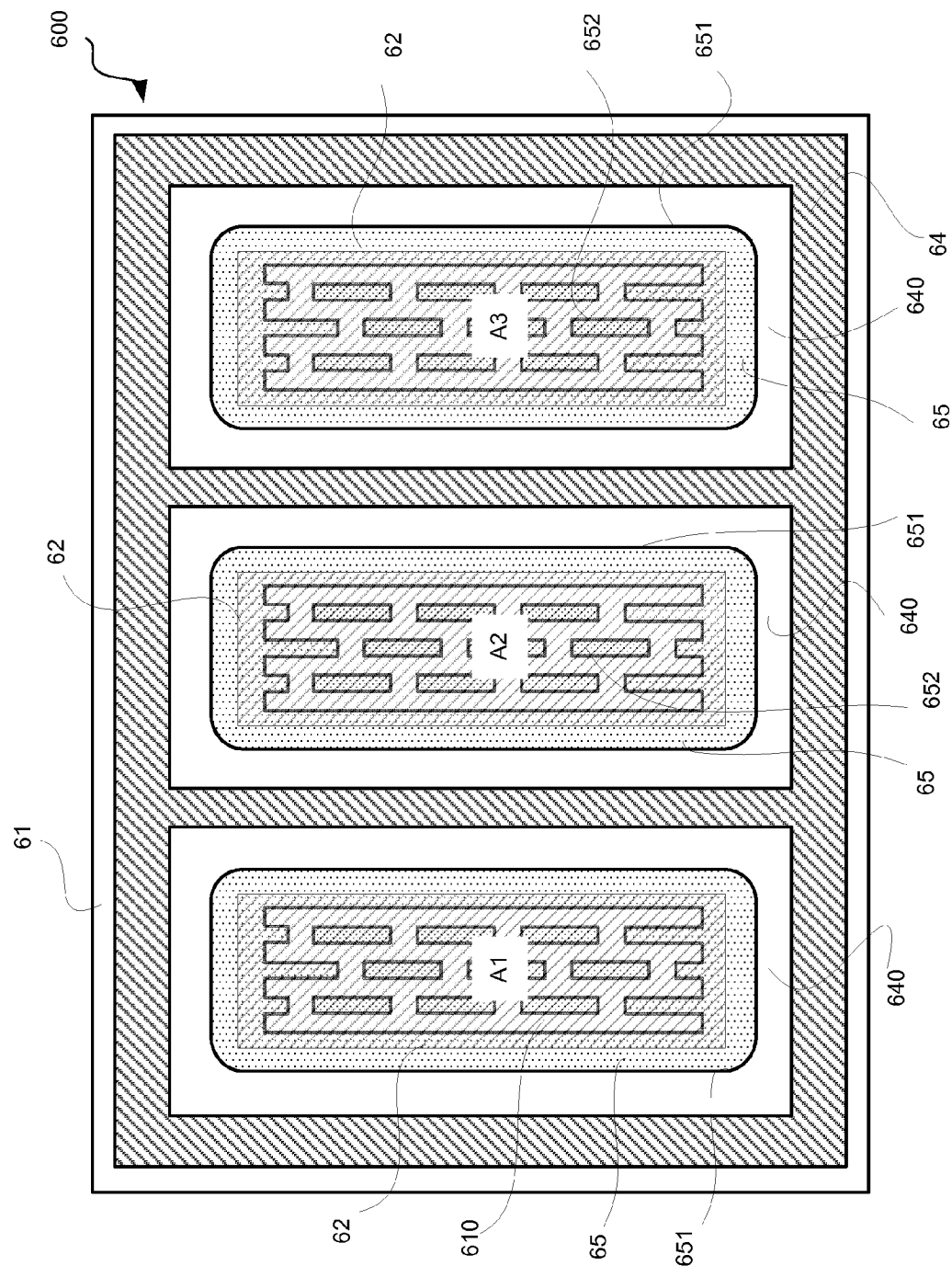
FIG. 6 illustrates a layout diagram of a Schottky diode 600 according to an embodiment of the present invention.

FIG. 6 illustrates a layout diagram of a Schottky diode 600 according to an embodiment of the present invention. The Schottky diode 600 comprises a cathode region 64 represented by pattern filled with up-right diagonal lines, a plurality of guard ring regions 65 represented by pattern filled with uniform dots, a plurality of metal Schottky contacts 62 represented by pattern filled with up-left diagonal lines and a semiconductor layer 61 represented by a blank pattern. The cathode region 64 may comprise cathode contact region and a metal layer formed above the cathode contact region. The cathode region 64 of Schottky diode 600 is placed more often in a lattice pattern having a plurality of windows 640, and each guard ring region 65 is formed in one window 640 of the lattice pattern. In this configuration, the anode of Schottky diode 600 is separated into a plurality of anode region islands A1, A2 and A3. Each anode region island A1, A2 or A3 comprises a metal Schottky contact 62. Each metal Schottky contact 62 is formed over one guard ring region 65 and overlaps semiconductor layer 61. Each guard ring region 65 in FIG. 6 comprises an outer guarding ring 651 and multiple inner open stripes 652. In one embodiment, the cathode region has other pattern in a configuration that the anode is divided into multiple anode islands, for example, the cathode region is in a grid shape. And in another embodiment, the cathode region partly encloses the anode islands. In some embodiments, the depth of the outer guard ring may be controlled to achieve a desired breakdown voltage. And in some embodiments, the space among the inner guard stripes 652, the space of the opening in a stripe, the length of a short stripe between two openings in a long stripe and the overlap between two neighboring stripes may be controlled to achieve a desired current drivability and/or the reverse leakage current.

Figure 7:
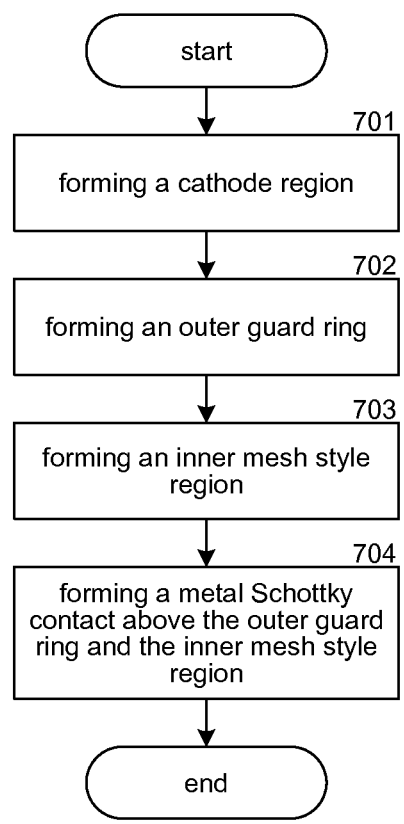
FIG. 7 illustrates a method of manufacturing a Schottky diode with mesh style region according to an embodiment of the present invention.

FIG. 7 illustrates a method of manufacturing a Schottky diode with mesh style region in accordance with an embodiment of the present invention.

In step 701, the method comprises manufacturing a cathode region.

In step 702, the method further comprises manufacturing an outer guard ring of P doping type in an N type semiconductor layer. In one embodiment, the outer guard ring is formed with a first depth and a first doping concentration. In one embodiment, the outer guard ring is in a closed ring shape, such as a circle ring or a square ring shape.

In step 703, the method further comprises manufacturing an inner mesh style region of P doping type in the N type semiconductor layer. The inner mesh style region is formed inside the outer guard ring and has a shallower junction depth than the outer guard ring. As a result, the outer guard ring encloses the inner mesh style region. And the inner mesh style region may have a much narrower shape than the outer guard ring. In one embodiment, forming the inner mesh style region further comprises forming a plurality of inner open stripes. And in one embodiment, the method further comprises adjusting the reverse leakage current and/or the packing density of the Schottky diode by controlling the overlap between two neighboring stripes, the space among the stripes and the opening of the stripes. When the overlap between two neighboring stripes is large, the space of the opening in a stripe is small, and the space among the stripes is smaller, a higher packing density and a lower reverse leakage current may be achieved.

The term of "mesh style region" means that the region has a plurality of open stripes which makes a depletion region of the Schottky diode having a mesh pattern from the top view, wherein the "mesh pattern" means that the depletion region other than the outer guard ring and the open stripes is connected as a net with eyes. The outer guard ring and the inner mesh style region constitute a guard ring region which intervenes with the Schottky interface. The term of "intervene" means that at least one direction can be found from a layout view of a semiconductor device and when dicing the semiconductor device in this direction, three or more stripes of the guard ring region may be found.

In one embodiment, the outer guard ring and the inner mesh style region are formed with ion implantation process. After the implantation process in steps 702 and 703, an anneal step may be performed to form the outer guard ring and the inner guard ring region.

In one embodiment, the method may further comprise adjusting the breakdown voltage of the Schottky diode by controlling the depth of the outer guard ring and adjusting the forward current drivability by controlling the depth of the inner mesh style region. When the depth of the outer guard ring increases, the breakdown voltage increases accordingly and when the depth of the inner mesh style region decreases, the forward current drivability increases accordingly.

And in step 704, a metal layer is formed over the guard ring region to form a Schottky contact of the Schottky diode. Additional steps such as forming NBL layer, or forming field oxide may be performed but may be omitted to simplify the description while not deviating from the spirit of the present invention. The manufacturing of the outer guard ring and the inner mesh style region in different steps results in that the inner mesh style region has a shallower junction depth than the outer guard ring and the outer guard ring encloses the inner mesh style region. In one embodiment, the inner mesh style region with shallower depth is formed before the outer guard ring is formed.

This method may not be performed with the sequence as shown in FIG. 7. The sequence may be changed. For example, in one embodiment, the inner mesh style region with shallower depth is formed before the outer guard ring is formed. In one embodiment, the cathode region is formed after forming the guard ring region.

The above embodiments relate to N type Schottky diode devices. However, P type devices with opposite doping types are also in spirit of the present invention. In one embodiment, a first doping type is N doping type and a second doping type is P doping type. And in another embodiment, the first doping type is P doping type and the second doping type is N doping type. N doping type is the type that a semiconductor material is doped with either phosphor, arsenic or any other suitable material such that charge is carried by electrons, and a P doping type is the type that a semiconductor material is doped with either boron, aluminum, gallium or any other suitable material such that charge is carried by holes.

In one experimental example, for a TiSi Schottky diode (the metal contact is Titanium and the semiconductor body is Silicon), with the conventional guard ring region as shown in FIG. 1, it has a breakdown voltage of 33 Volts and has a forward current to reverse current ratio of 9. While with the mesh style region as illustrated in FIG. 6, the Schottky diode having the same space area with the Schottky diode in FIG. 1 achieves a breakdown voltage of 59 Volts and a forward current to reverse current ratio of 165. Thus, the proposed solution may achieve a much more efficient and much smaller Schottky diode at a given current drivability. The above experimental example is for illustrative purpose only, and the feature(s) or advantage(s) the above example disclosing or implying comprise only part of the features and advantages pertaining to the present technology. Sometimes, the feature(s) or advantage(s) as illustrated in the experimental example can not be shown in other instances since the result(s) may be affected by other factor(s) which may not be disclosed herein.

While the above Detailed Description describes certain embodiments, the present invention is not limited to the features described and may be practice in many ways. Details of the system may vary in implementation, while still being encompassed by the present invention disclosed herein. Accordingly, the scope of the present invention encompasses not only the disclosed embodiments, but also all equivalent ways of practicing or implementing the present invention under the claims.

I claim:

1. A semiconductor device, comprising:
   a semiconductor layer of a first doping type;
   a guard ring region located in the semiconductor layer, wherein the guard ring region is of a second doping type, and wherein the guard ring region comprises:
      an outer guard ring; and
      an inner mesh style region having a plurality of parallel open stripes configured to form a depletion region;
   a metal Schottky contact located over the guard ring region; and
   a cathode contact region having the first doping type located in the semiconductor layer and outside of the guard ring region.

2. The semiconductor device of claim 1, wherein the outer guard ring comprises a closed ring shape enclosing the inner mesh style region, and wherein the mesh style region has a shallower junction depth than the outer guard ring.

3. The semiconductor device of claim 1, wherein a space of the opening in a stripe of the inner mesh style region is in a range of 0.5 µm~2 µm.

4. The semiconductor device of claim 3, wherein each open stripe of the inner mesh style region comprises a plurality of short stripes having a length of 2~3 times the space of the opening in the stripe of the inner mesh style region.

5. The semiconductor device of claim 3, wherein a minimum distance of two neighboring stripes is 0.5 µm and a maximum distance of two neighboring stripes is limited to the space of the opening in the stripe of the inner mesh style region.

6. The semiconductor device of claim 1, wherein an overlap between two neighboring stripes is in a range of 0.2 µm~1 µm.

7. The semiconductor device of claim 1, wherein the cathode contact region encloses the guard ring region.

8. The semiconductor device of claim 1, further comprising a plurality of guard ring regions and a plurality of Schottky contacts, wherein the cathode contact region has a lattice pattern having a plurality of windows, and wherein each of the plurality of guard ring regions is in one of the plurality of windows.

9. The semiconductor device of claim 1, wherein the outer guard ring is at the edge of the Schottky contact.

10. The semiconductor device of claim 1, further comprising a buried layer of the first doping type, wherein the buried layer has a higher doping concentration than said semiconductor layer and wherein the buried layer is formed between a semiconductor substrate and said semiconductor layer.

11. The semiconductor device of claim 1, wherein the Schottky contact comprises a metal layer.

12. The semiconductor device of claim 1, further comprising a field oxide between the Schottky contact and the cathode contact region.

13. A Schottky diode, comprising:
   a cathode region;
   an anode region, comprising a metal Schottky contact; and
   a guard ring region, wherein the guard ring region comprises an outer guard ring and a plurality of parallel inner open stripes inside the outer guard ring, and wherein the inner open stripe has a narrower width and a shallow junction depth than the outer guard ring; wherein
   the outer guard ring and the plurality of parallel open stripes are formed beneath and physically attached to a surface of the semiconductor layer, and are adhere to the metal Schottky contact.

14. The Schottky diode of claim 13, wherein said cathode region has a lattice pattern comprising a plurality of windows, configured to form a plurality of anode region islands, and wherein each anode region island is in one of the plurality of windows.

15. The Schottky diode of claim 13, wherein the cathode region comprises a cathode contact region of a first doping type and a metal contact above the cathode contact region.

16. The Schottky diode of claim 13, wherein the metal Schottky contact is Titanium.

* * * * *